United States Patent
Peng et al.

(10) Patent No.: US 11,125,589 B2
(45) Date of Patent: Sep. 21, 2021

(54) PHASE DEVIATION COMPENSATION METHOD AND APPARATUS

(71) Applicant: Gree Green Refrigeration Technology Center Co., Ltd. of Zhuhai, Guangdong (CN)

(72) Inventors: Yuli Peng, Guangdong (CN); Yusheng Hu, Guangdong (CN); Shengyu Xiao, Guangdong (CN); Chengbao Zhong, Guangdong (CN); Xi Zhou, Guangdong (CN); Yang Wang, Guangdong (CN)

(73) Assignee: Gree Green Refrigeration Technology Center Co., Ltd. of Zhuhai, Guangdong (CN)

( * ) Notice: Subject to any disclaimer, the term of this patent is extended or adjusted under 35 U.S.C. 154(b) by 0 days.

(21) Appl. No.: 16/629,331

(22) PCT Filed: Oct. 12, 2018

(86) PCT No.: PCT/CN2018/110001
§ 371 (c)(1),
(2) Date: Jan. 8, 2020

(87) PCT Pub. No.: WO2019/105133
PCT Pub. Date: Jun. 6, 2019

(65) Prior Publication Data
US 2020/0284626 A1    Sep. 10, 2020

(30) Foreign Application Priority Data

Nov. 28, 2017   (CN) .......................... 201711216022.1

(51) Int. Cl.
*G01D 5/247* (2006.01)
*G01D 18/00* (2006.01)

(52) U.S. Cl.
CPC .................................. *G01D 18/00* (2013.01)

(58) Field of Classification Search
CPC ....... G01D 18/00; G01D 5/2448; H03M 1/24; G01R 31/31937; G01R 19/02;
(Continued)

(56) References Cited

U.S. PATENT DOCUMENTS

| | | | | |
|---|---|---|---|---|
| 7,551,670 B2 * | 6/2009 | Matsumoto | .............. | H03K 7/04 375/239 |
| 2010/0045272 A1 * | 2/2010 | Kondo | .................... | G01D 5/145 324/207.13 |

(Continued)

FOREIGN PATENT DOCUMENTS

| CN | 101131329 A | 2/2008 |
|---|---|---|
| CN | 103185603 A | 7/2013 |

(Continued)

OTHER PUBLICATIONS

International Search Report, dated Jan. 11, 2019, in International application No. PCT/CN2018/110001, filed on Oct. 12, 2018.

(Continued)

*Primary Examiner* — Daniel Previl
(74) *Attorney, Agent, or Firm* — McAndrews, Held & Malloy, Ltd.

(57) ABSTRACT

A phase deviation compensation method and device are provided. The method may include: a first sine analog signal and a first cosine analog signal are acquired; the first sine analog signal is converted to a corresponding first sine digital signal, and the first cosine analog signal is converted to a corresponding first cosine digital signal; a sampler is controlled to sample the first sine analog signal and the first cosine analog signal according to variations of pulse edges of the first sine digital signal and the first cosine digital signal, to acquire at least one sine sampled signal and at least one cosine sampled signal; a phase deviation is determined; and phase compensation is performed on the at least one sine sampled signal and the at least one cosine sampled signal according to the phase deviation.

8 Claims, 2 Drawing Sheets

(58) Field of Classification Search
CPC ...... G01R 19/255; G01R 23/00; H04B 13/00;
H04B 13/005; H04B 14/046; H04B
14/048; H04B 1/7172; H04B 1/7176;
H04L 7/041; H04L 25/068; H04L 7/0008;
H04L 7/027; H04L 7/033; H04L 7/04;
G01S 13/913; G01S 1/245; G01S 7/2922;
G02F 1/0333; G06K 11/04; G06K 9/48;
G10L 15/00; G10L 21/06; G11B 20/225;
H03K 7/04; H04N 11/12; H04N 19/00;
H04N 5/919; H04N 9/12; H04N 9/16;
Y10S 388/901
USPC ...... 340/870.25–870.26, 870.19, 870.2, 929,
340/511–512, 539.22, 825.63–825.68
See application file for complete search history.

(56) References Cited

U.S. PATENT DOCUMENTS

| | | | | |
|---|---|---|---|---|
| 2012/0069854 | A1* | 3/2012 | Suzuki | H04B 10/65 |
| | | | | 370/465 |
| 2013/0014583 | A1* | 1/2013 | Kimpara | G01D 5/2073 |
| | | | | 73/504.01 |
| 2013/0069738 | A1* | 3/2013 | Tsuie | H03D 3/009 |
| | | | | 333/100 |
| 2013/0191919 | A1* | 7/2013 | Basavapatna | H04L 63/1408 |
| | | | | 726/25 |
| 2015/0036472 | A1* | 2/2015 | Saito | G11B 7/125 |
| | | | | 369/47.16 |
| 2016/0109269 | A1 | 4/2016 | Bowser | |
| 2016/0301336 | A1* | 10/2016 | Nishibata | G01D 5/2073 |

FOREIGN PATENT DOCUMENTS

| | | |
|---|---|---|
| CN | 103256946 A | 8/2013 |
| CN | 105526954 A | 4/2016 |
| CN | 205384031 U | 7/2016 |
| CN | 105987710 A | 10/2016 |
| CN | 106625020 A | 5/2017 |
| CN | 106936387 A | 7/2017 |
| CN | 108204830 A | 6/2018 |
| JP | 2006064402 A | 3/2006 |
| WO | 2011144457 A1 | 11/2011 |

OTHER PUBLICATIONS

Priority search report for Chinese application No. CN 201711216022.1.

First examination report for Japanese application No. JP2020501181A.

* cited by examiner

PHASE DEVIATION COMPENSATION METHOD AND APPARATUS

CROSS-REFERENCE TO RELATED APPLICATIONS

This application is a 371 of International Patent Application No. PCT/CN2018/110001, filed, Oct. 12, 2018 which claims priority to Chinese Patent No. 201711216022.1, titled Phase Deviation Compensation Method and Apparatus, filed with the Chinese Patent Office on Nov. 28, 2017. Contents of both of the present disclosures are hereby incorporated by reference in their entirety.

TECHNICAL FIELD

The present disclosure relates to the technical field of absolute encoders, and in particular to a phase deviation compensation method and apparatus.

BACKGROUND

With development of modern science and technology, a requirement of a person for a resolution of a photoelectric encoder has been becoming increasingly higher, while processing of a grating is limited by a production process and cost, in this way a grating pitch may not be reduced without limit. Therefore, application requirements of the present society are not satisfied depending on a physical resolution of the grating. In order to improve the resolution of the photoelectric encoder, a researcher put forward a signal subdivision technology. The signal subdivision technology plays a role of amplifying the grating pitch. When a sensor moves for one grating pitch, a photoelectric receiving circuit generates a sine wave electrical signal, and a resolution superior to the one grating pitch is acquired through interpolation, thereby improving the resolution of a measuring system.

During practical subdivision, in order to improve a subdivision accuracy of the photoelectric encoder, a subdivided signal needs to have good sinusoidal property. While during an encoder process, due to influence of the grating pitch, a black-to-white ratio of the grating, an assembling accuracy, off-centering of a code wheel and other factors, the subdivided signal is not an ideal sine wave. Therefore, the subdivided signal is to be corrected or compensated.

Researches show that a phase deviation between subdivided signals among factors influencing the subdivision accuracy of the encoder has the most significant influence, therefore how to acquire the phase deviation of the subdivided signal becomes a key of phase compensation and improvement of the subdivision accuracy. It is achieved through detecting a value of an intersection point between the subdivided signals in the related art. However this method is limited by an Analog-to-Digital (AD) sampling ratio, accordingly a high-frequency detection result is worsened, and high-frequency phase compensation accuracy is not ensured.

As to a problem that a phase deviation detection and compensation method of the subdivided signal of the absolute encoder in the related art is limited by the AD sampling ratio, and accordingly the high-frequency detection result is worsened, and the high-frequency phase compensation accuracy is not ensured, no effective solution has been provided yet so far.

SUMMARY

At least some embodiments of the present disclosure provide a phase deviation compensation method and device, so as at least to partially solve a problem that a phase deviation detection and compensation method of a subdivided signal of an absolute encoder in the related art is limited by an AD sampling ratio, and accordingly a high-frequency detection result is worsened, and high-frequency phase compensation accuracy is not ensured.

In an embodiment of the present disclosure, a phase deviation compensation method is provided. The method may include: a first sine analog signal and a first cosine analog signal are acquired, the first sine analog signal is converted to a corresponding first sine digital signal, the first cosine analog signal is converted to a corresponding first cosine digital signal, a sampler is controlled to sample the first sine analog signal and the first cosine analog signal according to variations of pulse edges of the first sine digital signal and the first cosine digital signal, to acquire at least one sine sampled signal and at least one cosine sampled signal, a phase deviation is determined according to the at least one sine sampled signal and the at least one cosine sampled signal, and phase compensation is performed on the first sine sampled signal and the first cosine sampled signal according to the phase deviation.

In some embodiments, the step that the sampler is controlled to sample the first sine analog signal and the first cosine analog signal according to the variations of the pulse edges of the first sine digital signal and the first cosine digital signal, to acquire the at least one sine sampled signal and the at least one cosine sampled signal may include: whether a pulse edge of the first sine digital signal is varied is detected, the sampler is controlled to sample the first cosine analog signal when a variation of the pulse edge of the first sine digital signal is detected, to acquire the at least one cosine sampled signal; whether a pulse edge of the first cosine digital signal is varied is detected, and the sampler is controlled to sample the first sine analog signal when a variation of the pulse edge of the first cosine digital signal is detected, to acquire the at least one sine sampled signal.

In some embodiments, the step that the phase deviation is determined according to the at least one sine sampled signal and the at least one cosine sampled signal may include: an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal is determined, and the phase deviation is determined according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

In some embodiments, the at least one sine sampled signal may include a first sine sampled signal and a second sine sampled signal, and the at least one cosine sampled signal may include a first cosine sampled signal and a second cosine sampled signal. The step that the phase deviation is determined according to the at least one sine sampled signal and the at least one cosine sampled signal may include: an amplitude corresponding to the first sine sampled signal, an amplitude corresponding to the second sine sampled signal, an amplitude corresponding to the first cosine sampled signal and an amplitude corresponding to the second cosine sampled signal are determined respectively, a first phase deviation is calculated according to the amplitude corresponding to the first sine sampled signal, a second phase deviation is calculated according to the amplitude corresponding to the second sine sampled signal, a third phase deviation is calculated according to the amplitude corresponding to the first cosine sampled signal, and a fourth phase deviation is calculated according to the amplitude corresponding to the second cosine sampled signal, a mean value of the first phase deviation, the second phase deviation, the third phase deviation and the fourth phase deviation is calculated, and the mean value of the first phase deviation, the second phase deviation, the third phase deviation and the fourth phase deviation is taken as the phase deviation.

In some embodiments, the step that the phase compensation is performed on the at least one sine sampled signal and the at least one cosine sampled signal according to the phase deviation may include: the phase compensation is performed, according to the phase deviation, on the at least one sine sampled signal through a preset algorithm to acquire at least one compensated sine sampled signal, and the phase compensation is performed, according to the phase deviation, on the at least one cosine sampled signal through a second preset algorithm to acquire at least one compensated cosine sampled signal.

In another embodiment the present disclosure, a phase deviation compensation apparatus is provided. The apparatus may include: a first acquisition element configured to acquire a first sine analog signal and a first cosine analog signal, a second acquisition element configured to convert the first sine analog signal to a corresponding first sine digital signal and convert the first cosine analog signal to a corresponding first cosine digital signal, a third acquisition element configured to control a sampler to sample the first sine analog signal and the first cosine analog signal according to variations of pulse edges of the first sine digital signal and the first cosine digital signal, to acquire at least one sine sampled signal and at least one cosine sampled signal, a determination element configured to determine a phase deviation according to the at least one sine sampled signal and the at least one cosine sampled signal, and a compensation element configured to perform phase compensation on the at least one sine sampled signal and the at least one cosine sampled signal according to the phase deviation.

In some embodiments, the third acquisition element may include: a first detection component configured to detect that whether a pulse edge of the first sine digital signal is varied, a first sampling component configured to control the sampler to sample the first cosine analog signal when a variation of the pulse edge of the first sine digital signal is detected, to acquire the at least one cosine sampled signal, a second detection component configured to detect that whether a pulse edge of the first cosine digital signal is varied, and a second sampling component configured to control the sampler to sample the first sine analog signal when a variation of the pulse edge of the first cosine digital signal is detected, to acquire the at least one sine sampled signal.

In some embodiments, the determination element may include: a first determination component configured to determine an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal, and a second determination component configured to determine the phase deviation according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

In some embodiments, the at least one sine sampled signal may include: a first sine sampled signal and a second sine sampled signal, and the at least one cosine sampled signal may include a first cosine sampled signal and a second cosine sampled signal. The determination element may include: a third determination component configured to respectively determine an amplitude corresponding to the first sine sampled signal, an amplitude corresponding to the second sine sampled signal, an amplitude corresponding to the first cosine sampled signal and an amplitude corresponding to the second cosine sampled signal, a first calculation component configured to respectively calculate a first phase deviation according to the amplitude corresponding to the first sine sampled signal, calculate a second phase deviation according to the amplitude corresponding to the second sine sampled signal, calculate a third phase deviation according to the amplitude corresponding to the first cosine sampled signal and calculate a fourth phase deviation according to the amplitude corresponding to the second cosine sampled signal, a second calculation component configured to calculate a mean value of the first phase deviation, the second phase deviation, the third phase deviation and the fourth phase deviation, and a fourth determination component configured to take the mean value of the first phase deviation, the second phase deviation, the third phase deviation and the fourth phase deviation as the phase deviation.

In some embodiments, the compensation element may include: a first compensation component configured to perform, according to the phase deviation, the phase compensation on the first sine sampled signal through a preset algorithm to acquire at least one compensated sine sampled signal, and a second compensation component configured to perform, according to the phase deviation, the phase compensation on the first cosine sampled signal through a second preset algorithm to acquire at least one compensated cosine sampled signal.

In another embodiment of the present disclosure, a storage medium is provided. The storage medium may include a stored program. The stored program may implement the phase deviation compensation method as mentioned above.

In another embodiment of the present disclosure, a processor is provided. The processor is configured to run a program. The program may implement, when running, the phase deviation compensation method as mentioned above.

Through at least some embodiments of the present disclosure, the first sine analog signal and the first cosine analog signal are acquired, the first sine analog signal is converted to the corresponding first sine digital signal, the first cosine analog signal is converted to the corresponding first cosine digital signal, the sampler is controlled to sample the first sine analog signal and the first cosine analog signal according to the variations of the pulse edges of the first sine digital signal and the first cosine digital signal, to acquire the at least one sine sampled signal and the at least one cosine sampled signal, the phase deviation is determined according to the at least one sine sampled signal and the at least one cosine sampled signal, and the phase compensation is performed on the at least one sine sampled signal and the at least one cosine sampled signal according to the phase deviation. Therefore, the problem, that the phase deviation detection and compensation method of the subdivided signal of the absolute encoder in the related art is limited by the AD sampling ratio, and accordingly the high-frequency detection result is worsened, and the high-frequency phase compensation accuracy is not ensured, is solved. The sampler is controlled to sample the first sine analog signal and the first cosine analog signal through the variations of the pulse edges of the first sine digital signal and the first cosine digital signal, thereby lowering a requirement for the AD sampling ratio (corresponding to a sampling ratio of the abovementioned sampler), and accordingly improving a high-frequency phase compensation effect of the subdivided signal and achieving an effect of enhancing the resolution and subdivision accuracy of the encoder.

BRIEF DESCRIPTION OF THE DRAWINGS

The accompanying drawings described herein are used for providing a further understanding of the present disclosure, and constitute a part of the present disclosure, and the exemplary embodiments of the present disclosure and the description thereof are used for explaining the present disclosure, but do not constitute improper limitations to the present disclosure. In the drawings.

DETAILED DESCRIPTION

It is to be noted that embodiments in the application and features in the embodiments may be combined with each other without conflict. The present disclosure will be described below in detail with reference to drawings and in combination with the embodiments.

In order to make the solutions of the present disclosure better understood by those skilled in the art, technical solutions in embodiments of the present disclosure will be clearly and completely described below in combination with the drawings in the embodiments of the present disclosure. It is apparent that the described embodiments are not all embodiments but part of embodiments of the present disclosure. All other embodiments obtained by those of ordinary skill in the art based on the embodiments in the disclosure without creative work shall fall within the scope of protection of the present disclosure.

It is to be noted that terms "first", "second" and the like in the description, claims and drawings of the present disclosure are adopted not to describe a specific sequence but to distinguish similar objects. It should be understood that data used in such a way may be interchangeable where appropriate, such that the embodiments of the present disclosure described here may be implemented in an order other than those illustrated or described here. In addition, terms "include" and "have" and any variations thereof are intended to cover nonexclusive inclusions. For example, a process, a method, a system, a product or a device including a series of operations or elements is not limited to the operations or elements which are expressly listed, but may alternatively further include operations or elements which are not expressly listed or alternatively further include other operations or elements intrinsic to the process, the method, the product or the device.

In order to facilitate description, part of nouns or terms involved in the embodiments of the present disclosure may be described below.

A Lissajous curve (also known as Lissajous graph or Bowditch curve) is a regular, stable and closed curve synthesized by simple harmonic vibrations having a simple ratio of integer and consisting of two frequencies in directions vertical to each other. By means of the Lissajous graph, a frequency ratio and a phase difference of two signals may be measured. In electrotechnology and radio technologies, an oscilloscope is usually used for observing the Lissajous graph and to accordingly measure a frequency or the phase difference.

Figure 1:
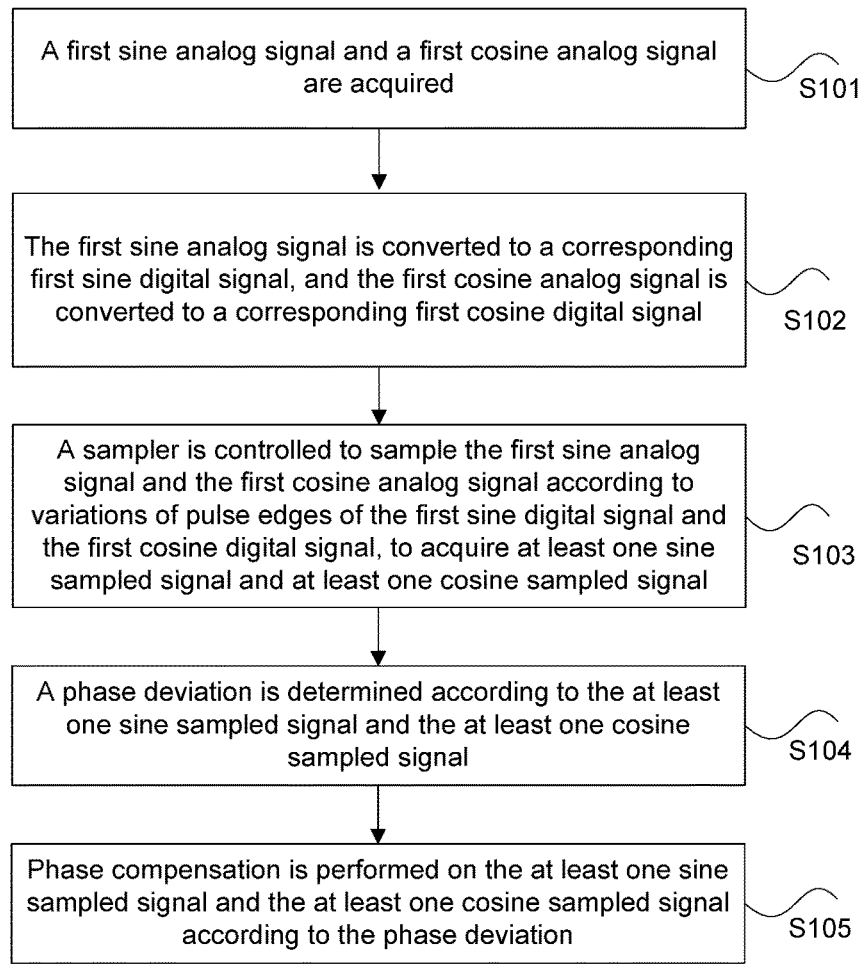
FIG. 1 is a flowchart of a phase deviation compensation method according to an embodiment of the present disclosure.

The present disclosure will be described below in combination with optional performing steps. FIG. 1 is a flowchart of a phase deviation compensation method according to an embodiment of the present disclosure. As shown in FIG. 1, the method includes the following steps.

At Step S101, a first sine analog signal and a first cosine analog signal are acquired.

Figure 2:
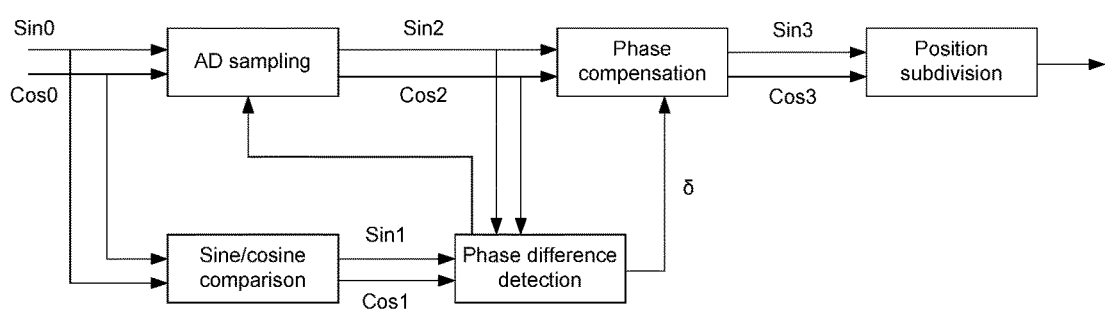
FIG. 2 is a schematic diagram of a phase deviation compensation method according to an optional embodiment of the present disclosure.
Figure 3:
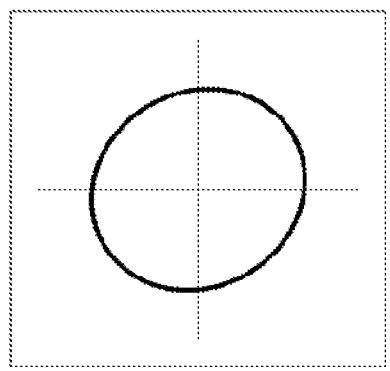
FIG. 3 is a sine/cosine Lissajous diagram before phase compensation according to an optional embodiment of the present disclosure.

For example, as shown in FIG. 2, analog signals Sin 0 and Cos 0 are input to a system. The signal Sin 0 is taken as the first sine analog signal mentioned above, and the signal Cos 0 is taken as the first cosine analog signal mentioned above. Due to limitation of production level, a certain phase deviation is existed between the signal Sin 0 and the signal Cos 0, and a Lissajous diagram of the certain phase deviation is shown in FIG. 3. Therefore, the signal Sin 0 and the signal Cos 0 are expressed with formulae:Sin $0=A*\text{Sin }\theta$; Cos $0=A*\text{Cos}(\theta+\delta)$.

At Step S102, the first sine analog signal is converted to a corresponding first sine digital signal, and the first cosine analog signal is converted to a corresponding first cosine digital signal.

As shown in FIG. 2, the signal Sin 0 (corresponding to the abovementioned first sine analog signal) and the signal Cos 0 (corresponding to the abovementioned first cosine analog signal) are respectively converted to a signal Sin 1 (corresponding to the abovementioned first sine digital signal) and a signal Cos 1 (corresponding to the abovementioned first cosine digital signal).

At Step S103, a sampler is controlled to sample the first sine analog signal and the first cosine analog signal according to variations of pulse edges of the first sine digital signal and the first cosine digital signal, to acquire at least one sine sampled signal and at least one cosine sampled signal.

The variation of the pulse edge of the signal Sin 1 is corresponding to $n*360°$ and $n*360°+180°$ of the signal Sin 0. The variation of the pulse edge of the signal Cos 1 is corresponding to $n*360°+90°$ and $n*360°+270°$ of the signal Cos 0, and n is an integer. An AD sampling is triggered according to edge variations of Sin 1 and Cos 1 pulses, to acquire current sampling values Sin 2 (corresponding to the abovementioned at least one sine sampled signal) and Cos 2 (corresponding to the abovementioned at least one cosine sampled signal).

Optionally, in the phase deviation compensation method provided in the embodiment of the present disclosure, the step that the sampler is controlled to sample the first sine analog signal and the first cosine analog signal according to the variations of the pulse edges of the first sine digital signal and the first cosine digital signal, to acquire the at least one sine sampled signal and the at least one cosine sampled signal may include: whether a pulse edge of the first sine digital signal is varied is detected, the sampler is controlled to sample the first cosine analog signal when a variation of the pulse edge of the first sine digital signal is detected, to acquire the at least one cosine sampled signal; whether a pulse edge of the first cosine digital signal is varied is detected, and the sampler is controlled to sample the first sine analog signal when a variation of the pulse edge of the first cosine digital signal is detected, to acquire the at least one sine sampled signal.

It is to be noted that there may be multiple sine sampled signals, and there may be multiple cosine sampled signals. For example, the sampling is implemented at a rising edge of the signal Sin 1 to acquire signal Cos $2_1$, the sampling is implemented at a falling edge of the signal Sin 1 to acquire signal Cos $2_2$, the sampling is implemented at a rising edge of the signal Cos 1 to acquire signal Sin $2_1$, and the sampling is implemented at a falling edge of the signal Cos 1 to acquire signal Sin $2_2$.

At Step S104, a phase deviation is determined according to the at least one sine sampled signal and the at least one cosine sampled signal.

Optionally, in the phase deviation compensation method provided in the embodiment of the present disclosure, the phase deviation is determined according to the first sine sampled signal and the first cosine sampled signal may include: an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal is determined, and the phase deviation is determined according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

For example, the sampling is implemented at the rising edge of the signal Sin 1 to acquire the signal Cos 2, and an amplitude of the signal Cos 2 should ideally be A. Since there is a phase deviation δ, actual amplitude of the signal Cos 2 should be A1. Therefore, the phase deviation is calculated:

$\delta/2 = \arccos(A1)$.

The phase deviation between subdivided signals is calculated and acquired according to a corresponding relationship between a known varied pulse edge and an angle. The phase deviation of the subdivided signal is detected with the abovementioned method, thereby effectively lowering a requirement for an AD sampling ratio. For example, in presence of an encoder with 512 lines for each circle and a maximum revolving speed 6000 rpm, an intersection point value detection method is taken to sample, the AD sampling ratio needs to achieve 3686.4 KHz. The sampling ratio of the AD with the sampling method mentioned in the present disclosure needs to achieve 204.8 KHz. In this way, the requirement for the AD sampling ratio is effectively lowered.

In order to improve a phase deviation detection accuracy, optionally, in the phase deviation compensation method provided in the embodiment of the present disclosure, the first sine sampled signal may include a first sine sampled signal and a second sine sampled signal, and the first cosine sampled signal may include a first cosine sampled signal and a second cosine sampled signal. The step that the phase deviation is determined according to the first sine sampled signal and the first cosine sampled signal may include: an amplitude corresponding to the first sine sampled signal, an amplitude corresponding to the second sine sampled signal, an amplitude corresponding to the first cosine sampled signal and an amplitude corresponding to the second cosine sampled signal are determined respectively, a first phase deviation is calculated according to the amplitude corresponding to the first sine sampled signal, a second phase deviation is calculated according to the amplitude corresponding to the second sine sampled signal, a third phase deviation is calculated according to the amplitude corresponding to the first cosine sampled signal, and a fourth phase deviation is calculated according to the amplitude corresponding to the second cosine sampled signal respectively, a mean value of the first phase deviation, the second phase deviation, the third phase deviation and the fourth phase deviation is calculated, and the mean value of the first phase deviation, the second phase deviation, the third phase deviation and the fourth phase deviation is taken as the phase deviation.

Figure 4:
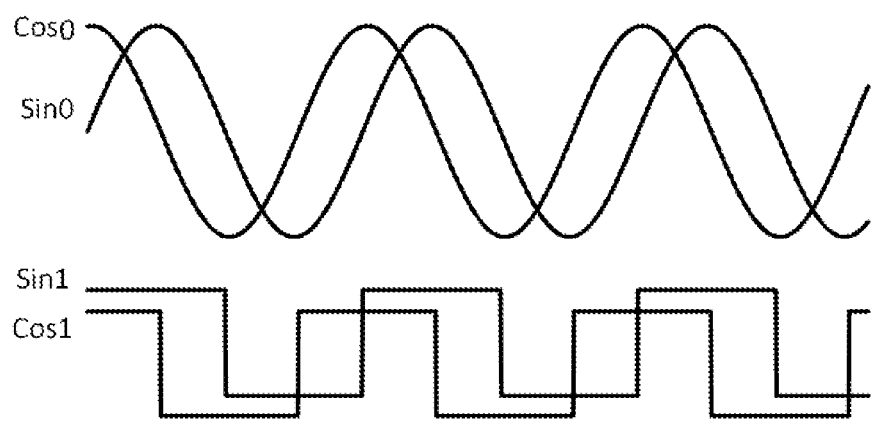
FIG. 4 is a schematic diagram of a signal before phase compensation according to an optional embodiment of the present disclosure.

As shown in FIG. 4, four times of phase deviations are calculated and acquired according to four times of edge variations of the signal Sin 1 and the signal Cos 1 within a cycle. The mean value of the four times of phase deviations is taken as a final phase deviation. In this way, the phase deviation detection accuracy is improved.

At Step S105, phase compensation is performed on the at least one sine sampled signal and the at least one cosine sampled signal according to the phase deviation.

Optionally, in the phase deviation compensation method provided in the embodiment of the present disclosure, the step that the phase compensation is performed on the at least one sine sampled signal and the at least one cosine sampled signal according to the phase deviation may include: the phase compensation is performed, according to the phase deviation, on the at least one sine sampled signal through a preset algorithm to acquire at least one compensated sine sampled signal, and the phase compensation is performed, according to the phase deviation, on the at least one cosine sampled signal through a second preset algorithm to acquire at least one compensated cosine sampled signal.

According to the phase deviation calculated in the abovementioned steps, the phase compensation is respectively performed on the signal Sin 2 and the signal Cos 2, to acquire the signal Sin 3 and the signal Cos 3.

Sin $3 = A*\sin\theta + \tan(\delta/2)*A*\cos(\theta+\delta)$;

Cos $3 = A*\cos(\theta+\delta) + \tan(\delta/2)*A*\sin\theta$.

According to the compensated signal Sin 3 and the compensated signal Cos 3, angle subdivision is achieved according to an arctangent method: $\Theta = \arctan(\sin 3/\cos 3)$. In this way, a resolution of the encoder is improved.

To sum up, through acquiring the first sine analog signal and the first cosine analog signal, the phase deviation compensation method provided in the embodiment of the present disclosure converts the first sine analog signal to the corresponding first sine digital signal, while converting the first cosine analog signal to the corresponding first cosine digital signal, controlling the sampler to sample the first sine analog signal and the first cosine analog signal according to the variations of the pulse edges of the first sine digital signal and the first cosine digital signal, to acquire the at least one sine sampled signal and the at least one cosine sampled signal, determining the phase deviation according to the at least one sine sampled signal and the at least one cosine sampled signal, and performing the phase compensation on the at least one sine sampled signal and the at least one cosine sampled signal according to the phase deviation. Therefore, the problem, that the phase deviation detection and compensation method of the subdivided signal of an absolute encoder in the related art is limited by the AD sampling ratio, and accordingly a high-frequency detection result is worsened, and a high-frequency phase compensation accuracy is not ensured, is solved. Through the variations of the pulse edges of the first sine digital signal and the first cosine digital signal, the sampler is controlled to sample the first sine analog signal and the first cosine analog signal, thereby lowering the requirement for the AD sampling ratio (corresponding to the sampling ratio of the abovementioned sampler), and accordingly improving a high-frequency phase compensation effect of the subdivided signal and achieving an effect of enhancing the resolution and subdivision accuracy of the encoder.

It is to be noted that the steps shown in the flowchart of the drawings may be implemented in a computer system having, for example, a group of computer executable instructions. In addition, although a logic order is shown in the flowchart, the steps shown or described may be implemented in an order differing from the one herein in some circumstances.

Another embodiment of the present disclosure further provides a phase deviation compensation apparatus. It is to be noted that the phase deviation compensation apparatus of the embodiment of the present disclosure may be configured to implement the phase deviation compensation method provided in the embodiment of the present disclosure. The phase deviation compensation apparatus provided in the embodiment of the present disclosure will be introduced below.

Figure 5:
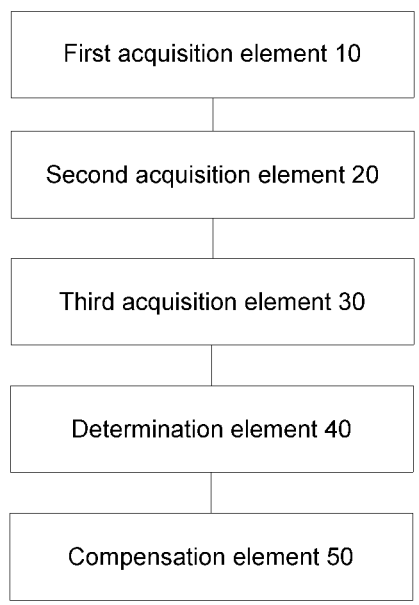
FIG. 5 is a schematic diagram of a phase deviation compensation apparatus according to an embodiment of the present disclosure.

FIG. 5 is a schematic diagram of a phase deviation compensation apparatus according to an embodiment of the present disclosure. As shown in FIG. 5, the apparatus includes: a first acquisition element 10, a second acquisition element 20, a third acquisition element 30, a determination element 40 and a compensation element 50.

Specifically, the first acquisition element 10 is configured to acquire a first sine analog signal and a first cosine analog signal.

The second acquisition element 20 is configured to convert the first sine analog signal to a corresponding first sine digital signal and convert the first cosine analog signal to a corresponding first cosine digital signal.

The third acquisition element 30 is configured to control a sampler to sample the first sine analog signal and the first cosine analog signal according to variations of pulse edges of the first sine digital signal and the first cosine digital signal, to acquire at least one sine sampled signal and at least one cosine sampled signal.

The determination element 40 is configured to determine a phase deviation according to the at least one sine sampled signal and the at least one cosine sampled signal.

The compensation element 50 is configured to perform phase compensation on the at least one sine sampled signal and the at least one cosine sampled signal according to the phase deviation.

Through the phase deviation compensation apparatus provided in the embodiment of the present disclosure, the first acquisition element 10 acquires the first sine analog signal and the first cosine analog signal, accordingly the second acquisition element 20 converts the first sine analog signal to the corresponding first sine digital signal and converts the first cosine analog signal to the corresponding first cosine digital signal, the third acquisition element 30 controls the sampler to sample the first sine analog signal and the first cosine analog signal according to the variations of the pulse edges of the first sine digital signal and the first cosine digital signal, to acquire the at least one sine sampled signal and the at least one cosine sampled signal, the determination element 40 determines the phase deviation according to the at least one sine sampled signal and the at least one cosine sampled signal, and the compensation element 50 performs the phase compensation on the at least one sine sampled signal and the at least one cosine sampled signal according to the phase deviation. In this way, the problem, that a phase deviation detection and compensation method of a subdivided signal of an absolute encoder in the related art is limited by an AD sampling ratio, and accordingly a high-frequency detection result is worsened, and a high-frequency phase compensation accuracy is not ensured, is solved. Through the variations of the pulse edges of the first sine digital signal and the first cosine digital signal, the sampler is controlled to sample the first sine analog signal and the first cosine analog signal. In this way, a requirement for the AD sampling ratio (corresponding to the sampling ratio of the abovementioned sampler) is lowered, and accordingly a high-frequency phase compensation effect of the subdivided signal is improved and an effect of enhancing a resolution and a subdivision accuracy of the encoder is achieved.

Optionally, in the phase deviation compensation apparatus provided in the embodiment of the present disclosure, the third acquisition element may include: a first detection component configured to detect that whether a pulse edge of the first sine digital signal is varied, a first sampling component configured to control the sampler to sample the first cosine analog signal when a variation of the pulse edge of the first sine digital signal is detected, to acquire the at least one cosine sampled signal, a second detection component configured to detect that whether a pulse edge of the first cosine digital signal is varied, and a second sampling component configured to control the sampler to sample the first sine analog signal when a variation of the pulse edge of the first cosine digital signal is detected, to acquire the at least one sine sampled signal.

Optionally, in the phase deviation compensation apparatus provided in the embodiment of the present disclosure, the determination element may include: a first determination component configured to determine an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal, and a second determination component configured to determine the phase deviation according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

Optionally, in the phase deviation compensation apparatus provided in the embodiment of the present disclosure, the at least one sine sampled signal may include: a first sine sampled signal and a second sine sampled signal, and the at least one cosine sampled signal may include a first cosine sampled signal and a second cosine sampled signal. The determination element may include: a third determination component configured to respectively determine an amplitude corresponding to the first sine sampled signal, an amplitude corresponding to the second sine sampled signal, an amplitude corresponding to the first cosine sampled signal and an amplitude corresponding to the second cosine sampled signal, a first calculation component configured to respectively calculate a first phase deviation according to the amplitude corresponding to the first sine sampled signal, calculate a second phase deviation according to the amplitude corresponding to the second sine sampled signal, calculate a third phase deviation according to the amplitude corresponding to the first cosine sampled signal and calculate a fourth phase deviation according to the amplitude corresponding to the second cosine sampled signal, a second calculation component configured to calculate a mean value of the first phase deviation, the second phase deviation, the third phase deviation and the fourth phase deviation, and a fourth determination component configured to take the mean value of the first phase deviation, the second phase deviation, the third phase deviation and the fourth phase deviation as the phase deviation.

Optionally, in the phase deviation compensation apparatus provided in the embodiment of the present disclosure, the compensation element may include: a first compensation component configured to perform, according to the phase deviation, the phase compensation on the first sine sampled signal through a preset algorithm to acquire at least one compensated sine sampled signal, and a second compensation component configured to perform, according to the phase deviation, the phase compensation on the first cosine sampled signal through a second preset algorithm to acquire at least one compensated cosine sampled signal.

The phase deviation compensation apparatus may include a processor and a memory. The abovementioned first acquisition element 10, the abovementioned second acquisition element 20, the abovementioned third acquisition element 30, the abovementioned determination element 40 and the abovementioned compensation element 50 are taken as program elements to be stored in the memory. The processor implements the abovementioned program elements stored in the memory to achieve a corresponding function.

The processor may include a core which calls the corresponding program element from the memory. At least one core is configured. The requirement for the AD sampling ratio is lowered by adjusting parameters of the core. In this way, the high-frequency phase compensation effect of the subdivided signal is improved, and the effect of enhancing the resolution and the subdivision accuracy of the encoder is achieved.

The memory may include a volatile memory, a Random Access Memory (RAM) and/or a nonvolatile memory and other forms in a computer readable medium, for example, a Read-Only Memory (ROM) or a flash RAM. The memory may include at least one memory chip.

The embodiment of the present disclosure provides a memory medium on which a program is stored. When implemented by the processor, the program achieves the phase deviation compensation method.

The embodiment of the present disclosure provides a processor. The processor is configured to run a program. The program implements the phase deviation compensation method when running.

The embodiment of the present disclosure provides a device, including a processor, a memory and a program stored on the memory and capable of running on the processor. The following steps are achieved when the processor implements the program: a first sine analog signal and a first cosine analog signal are acquired, the first sine analog signal is converted to a corresponding first sine digital signal, the first cosine analog signal is converted to a corresponding first cosine digital signal, a sampler is controlled to sample the first sine analog signal and the first cosine analog signal according to variations of pulse edges of the first sine digital signal and the first cosine digital signal, to acquire at least one sine sampled signal and at least one cosine sampled signal, a phase deviation is determined according to the at least one sine sampled signal and the at least one cosine sampled signal, and phase compensation is performed on the first sine sampled signal and the first cosine sampled signal according to the phase deviation.

The step that the sampler is controlled to sample the first sine analog signal and the first cosine analog signal according to the variations of the pulse edges of the first sine digital signal and the first cosine digital signal, to acquire the at least one sine sampled signal and the at least one cosine sampled signal may include: whether a pulse edge of the first sine digital signal is varied is detected, the sampler is controlled to sample the first cosine analog signal when a variation of the pulse edge of the first sine digital signal is detected, to acquire the at least one cosine sampled signal; whether a pulse edge of the first cosine digital signal is varied is detected, and the sampler is controlled to sample the first sine analog signal when a variation of the pulse edge of the first cosine digital signal is detected, to acquire the at least one sine sampled signal.

The step that the phase deviation is determined according to the at least one sine sampled signal and the at least one cosine sampled signal may include: an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal is determined, and the phase deviation is determined according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

The at least one sine sampled signal may include a first sine sampled signal and a second sine sampled signal, and the at least one cosine sampled signal may include a first cosine sampled signal and a second cosine sampled signal. The step that the phase deviation is determined according to the at least one sine sampled signal and the at least one cosine sampled signal may include: an amplitude corresponding to the first sine sampled signal, an amplitude corresponding to the second sine sampled signal, an amplitude corresponding to the first cosine sampled signal and an amplitude corresponding to the second cosine sampled signal are determined respectively, a first phase deviation is calculated according to the amplitude corresponding to the first sine sampled signal, a second phase deviation is calculated according to the amplitude corresponding to the second sine sampled signal, a third phase deviation is calculated according to the amplitude corresponding to the first cosine sampled signal, and a fourth phase deviation is calculated according to the amplitude corresponding to the second cosine sampled signal, a mean value of the first phase deviation, the second phase deviation, the third phase deviation and the fourth phase deviation is calculated, and the mean value of the first phase deviation, the second phase deviation, the third phase deviation and the fourth phase deviation is taken as the phase deviation.

The step that the phase compensation is performed on the at least one sine sampled signal and the at least one cosine sampled signal according to the phase deviation may include: the phase compensation is performed, according to the phase deviation, on the at least one sine sampled signal through a preset algorithm to acquire at least one compensated sine sampled signal, and the phase compensation is performed, according to the phase deviation, on the at least one cosine sampled signal through a second preset algorithm to acquire at least one compensated cosine sampled signal. The device mentioned herein may be a server, a personal computer (PC), a PAD and the like.

The present disclosure further provides a computer program product. When implemented on a data processing device, the computer program product is suitable to implement the program in which initialization has the following method steps: a first sine analog signal and a first cosine analog signal are acquired, the first sine analog signal is converted to a corresponding first sine digital signal, the first cosine analog signal is converted to a corresponding first cosine digital signal, a sampler is controlled to sample the first sine analog signal and the first cosine analog signal according to variations of pulse edges of the first sine digital signal and the first cosine digital signal, to acquire at least one sine sampled signal and at least one cosine sampled signal, a phase deviation is determined according to the at least one sine sampled signal and the at least one cosine sampled signal, and phase compensation is performed on the first sine sampled signal and the first cosine sampled signal according to the phase deviation.

The step that the sampler is controlled to sample the first sine analog signal and the first cosine analog signal according to the variations of the pulse edges of the first sine digital signal and the first cosine digital signal, to acquire the at least one sine sampled signal and the at least one cosine sampled signal may include: whether a pulse edge of the first sine digital signal is varied is detected, the sampler is controlled to sample the first cosine analog signal when a variation of the pulse edge of the first sine digital signal is detected, to acquire the at least one cosine sampled signal; whether a pulse edge of the first cosine digital signal is varied is detected, and the sampler is controlled to sample the first sine analog signal when a variation of the pulse edge of the first cosine digital signal is detected, to acquire the at least one sine sampled signal.

The step that the phase deviation is determined according to the at least one sine sampled signal and the at least one cosine sampled signal may include: an amplitude corresponding to the at least one sine sampled signal and an amplitude corresponding to the at least one cosine sampled signal, or an amplitude corresponding to the at least one sine sampled signal, or an amplitude corresponding to the at least one cosine sampled signal is determined, and the phase deviation is determined according to the amplitude corresponding to the at least one sine sampled signal and the amplitude corresponding to the at least one cosine sampled signal, or an amplitude corresponding to the at least one sine sampled signal, or an amplitude corresponding to the at least one cosine sampled signal.

The at least one sine sampled signal may include a first sine sampled signal and a second sine sampled signal, and the at least one cosine sampled signal may include a first cosine sampled signal and a second cosine sampled signal. The step that the phase deviation is determined according to the at least one sine sampled signal and the at least one cosine sampled signal may include: an amplitude corresponding to the first sine sampled signal, an amplitude corresponding to the second sine sampled signal, an amplitude corresponding to the first cosine sampled signal and an amplitude corresponding to the second cosine sampled signal are determined respectively, a first phase deviation is calculated according to the amplitude corresponding to the first sine sampled signal, a second phase deviation is calculated according to the amplitude corresponding to the second sine sampled signal, a third phase deviation is calculated according to the amplitude corresponding to the first cosine sampled signal, and a fourth phase deviation is calculated according to the amplitude corresponding to the second cosine sampled signal, a mean value of the first phase deviation, the second phase deviation, the third phase deviation and the fourth phase deviation is calculated, and the mean value of the first phase deviation, the second phase deviation, the third phase deviation and the fourth phase deviation is taken as the phase deviation.

The step that the phase compensation is performed on the at least one sine sampled signal and the at least one cosine sampled signal according to the phase deviation may include: the phase compensation is performed, according to the phase deviation, on the at least one sine sampled signal through a preset algorithm to acquire at least one compensated sine sampled signal, and the phase compensation is performed, according to the phase deviation, on the at least one cosine sampled signal through a second preset algorithm to acquire at least one compensated cosine sampled signal.

Those skilled in the art should understand that embodiments of the disclosure may provide a method, a system or a computer program product. Thus, forms of hardware embodiments, full software embodiments or embodiments integrating software and hardware may be adopted in the present disclosure. Moreover, a form of the computer program product implemented on at least one computer available storage media (including, but not limited to, a disk memory, a Compact Disc Read-Only Memory (CD-ROM), an optical memory and the like) containing computer available program codes may be adopted in the present disclosure.

The present disclosure is described with reference to flowchart and/or block diagrams of the method, the device (system) and the computer program product according to the embodiments of the present disclosure. It should be understood that each flow and/or block in the flowcharts and/or the block diagrams and a combination of the flow and/or the block in the flowcharts and/or the block diagrams may be realized by computer program instructions. These computer program instructions may be provided for a general computer, a dedicated computer, an embedded processor or processors of other programmable data processing devices to generate a machine, so that an apparatus for realizing functions assigned in at least one flow of the flowcharts and/or at least one block of the block diagrams is generated via instructions executed by the computers or the processors of the other programmable data processing devices.

These computer program instructions may also be stored in a computer readable memory capable of guiding the computers or the other programmable data processing devices to work in a specific mode, so that a manufactured product including an instruction apparatus is generated via the instructions stored in the computer readable memory, and the instruction apparatus realizes the functions assigned in at least one flow of the flowcharts and/or at least one block of the block diagrams.

These computer program instructions may also be loaded to the computers or the other programmable data processing devices, so that processing realized by the computers is generated by executing a series of operation steps on the computers or the other programmable devices, and therefore the instructions executed on the computers or the other programmable devices provide a step of realizing the functions assigned in at least one flow of the flowcharts and/or at least one block of the block diagrams.

In a typical configuration, a computing device may include at least one Central Processing Unit (CPU), input/output interfaces, network interfaces and memories.

The memory may include a volatile memory, a Random Access Memory (RAM) and/or a nonvolatile memory and other forms in a computer readable medium, for example, a Read-Only Memory (ROM) or a flash RAM. The memory is an example of a computer readable medium.

The computer readable medium may include permanent and impermanent computer readable media, and mobile and immovable media, and information storage may be achieved with any method or technology. Information may be computer readable instructions, data structures, program components or other data. The storage medium of a computer may include, but is not limited to, a phase-change Random Access Memory (PRAM), a Static Random-Access Memory (SRAM), a Dynamic Random Access Memory (DRAM), other types of RAMs, Read-Only Memories (ROM), an Electrically Erasable Programmable Read-Only Memory (EEPROM), a flash memory or other memory technologies, a Compact Disc Read-Only Memory (CD-ROM), a Digital Video Disk (DVD) or other optical storages, a magnetic tape cartridge, a magnetic tape, a magnetic disc for storage or other magnetic storage devices or any other non-transmission medium that may be used to store the information accessible by the computing device. According to definition herein, the computer readable medium may not include transitory media, for example, a modulated data signal and a carrier.

It is to be further noted that terms "include" and "have" and any transformation thereof are intended to cover non-exclusive inclusions. In this way, a process, a method, a system, a product or a device including a series of factors not only includes these factors, but other factors which are not listed clearly or further includes other intrinsic factors of the process, method, the product or the device. Under a situation that there is no other limitation, the factor defined by a sentence "includes a . . . " is not intended to exclude that there are other identical factors in the process, method, the product or the device including the factors.

Those skilled in the art should understand that the embodiments of the disclosure may provide the method, the system or the computer program product. Thus, forms of hardware embodiments, full software embodiments or embodiments integrating software and hardware may be adopted in the present disclosure. Moreover, a form of the computer program product implemented on at least one computer available storage media (including, but not limited to, a disk memory, a Compact Disc Read—Only Memory (CD-ROM), an optical memory and the like) containing computer available program codes may be adopted in the present disclosure.

The above are exemplary embodiments of the present disclosure, and are not intended to limit the present disclosure. For those skilled in the art, the present disclosure may have various modifications and variations. Any modifications, equivalent replacements, improvements and the like within the spirit and principle of the present disclosure shall fall within the scope of protection as defined in the appended claims of the present disclosure.

What is claimed is:

1. A phase deviation compensation method, comprising:
acquiring a first sine analog signal and a first cosine analog signal;
converting the first sine analog signal to a corresponding first sine digital signal, converting the first cosine analog signal to a corresponding first cosine digital signal;
controlling a sampler to sample the first sine analog signal and the first cosine analog signal according to variations of pulse edges of the first sine digital signal and the first cosine digital signal, to acquire at least one sine sampled signal and at least one cosine sampled signal;
determining a phase deviation according to the at least one sine sampled signal and the at least one cosine sampled signal; and
performing phase compensation on the at least one sine sampled signal and the at least one cosine sampled signal according to the phase deviation;
wherein the at least one sine sampled signal comprises a first sine sampled signal and a second sine sampled signal, and the at least one cosine sampled signal comprises a first cosine sampled signal and a second cosine sampled signal; determining the phase deviation according to the at least one sine sampled signal and the at least one cosine sampled signal comprises:
respectively detrmining an amplitude corresponding to the first sine sampled signal, an amplitude corresponding to the second sine sampled signal, an amplitude corresponding to the first cosine sampled signal and an amplitude corresponding to the second cosine sampled signal;
calculating a first phase deviation according to the amplitude corresponding to the first sine sampled signal, calculating a second phase deviation according to the amplitude corresponding to the second sine sampled signal, calculating a third phase deviation according to the amplitude corresponding to the first cosine sampled signal, and calculating a fourth phase deviation according to the amplitude corresponding to the second cosine sampled signal;
calculating a mean value of the first phase deviation, the second phase deviation, the third phase deviation and the fourth phase deviation; and
taking the mean value of the first phase deviation, the second phase deviation the third phase deviation and the fourth phase deviation as the phase deviation.

2. The method as claimed in claim 1, wherein controlling the sampler to sample the first sine analog signal and the first cosine analog signal according to the variations of the pulse edges of the first sine digital signal and the first cosine digital signal, to acquire the at least one sine sampled signal and the at least one cosine sampled signal comprises:
detecting that whether a pulse edge of the first sine digital signal is varied;
controlling the sampler to sample the first cosine analog signal when a variation of the pulse edge of the first sine digital signal is detected, to acquire the at least one cosine sampled signal;
detecting that whether a pulse edge of the first cosine digital signal is varied; and
controlling the sampler to sample the first sine analog signal when a variation of the pulse edge of the first cosine digital signal is detected, to acquire the at least one sine sampled signal.

3. The method as claimed in claim 1, wherein performing the phase compensation on the first sine sampled signal and the first cosine sampled signal according to the phase deviation comprises:
performing, according to the phase deviation, the phase compensation on the at least one sine sampled signal through a preset algorithm to acquire at least one compensated sine sampled signal; and performing, according to the phase deviation, the phase compensation on the at least one cosine sampled signal through a second preset algorithm to acquire at least one compensated cosine sampled signal.

4. A storage medium, wherein the storage medium comprises a stored program, wherein the stored program implements the phase deviation compensation method as claimed in claim 1.

5. A processor, wherein the processor is configured to run a program, wherein the program implements the phase deviation compensation method as claimed in claim 1 when running.

6. A phase deviation compensation apparatus, comprising:
a first acquisition element, configured to acquire a first sine analog signal and a first cosine analog signal;
a second acquisition element, configured to convert the first sine analog signal to a corresponding first sine digital signal and convert the first cosine analog signal to a corresponding first cosine digital signal;
a third acquisition element, configured to control a sampler to sample the first sine analog signal and the first cosine analog signal according to variations of pulse edges of the first sine digital signal and the first cosine digital signal, to acquire at least one sine sampled signal and at least one cosine sampled signal;
a determination element, configured to determine a phase deviation according to the at least one sine sampled signal and the at least one cosine sampled signal; and
a compensation element, configured to perform phase compensation on the at least one sine sampled signal and the at least one cosine sampled signal according to the phase deviation;
wherein the at least one sine sampled signal comprises a first sine sampled signal and a second sine sampled signal, and the at least one cosine sampled signal comprises a first cosine sampled signal and a second cosine sampled signal; the determination element comprises:
a third determination component, configured to respectively determine an amplitude corresponding to the first sine sampled signal, an amplitude corresponding to the second sine sampled signal, an amplitude corresponding to the first cosine sampled signal and an amplitude corresponding to the second cosine sampled signal;
a first calculation component, configured to respectively calculate a first phase deviation according to the amplitude corresponding to the first sine sampled signal, calculate a second phase deviation according to the amplitude corresponding to the second sine sampled signal, calculate a third phase deviation according to the amplitude corresponding to the first cosine sampled signal, and calculate a fourth phase deviation according to the amplitude corresponding to the second cosine sampled signal;
a second calculation component, configured to calculate a mean value of the first phase deviation, the second phase deviation, the third phase deviation, and the fourth phase deviation; and
a fourth determination component, configured to take the mean value of the first phase deviation, the second phase deviation, the third phase deviation and the fourth phase deviation as the phase deviation.

7. The apparatus as claimed in claim 6, wherein the third acquisition element comprises:
a first detection component, configured to detect that whether a pulse edge of the first sine digital signal is varied;
a first sampling component, configured to control the sampler to sample the first cosine analog signal when a variation of the pulse edge of the first sine digital signal is detected, to acquire the at least one cosine sampled signal;
a second detection component, configured to detect that whether a pulse edge of the first cosine digital signal is varied; and
a second sampling component, configured to control the sampler to sample the first sine analog signal when a variation of the pulse edge of the first cosine digital signal is detected, to acquire the at least one sine sampled signal.

8. The apparatus as claimed in claim 6, wherein the compensation element comprises:
a first compensation component, configured to perform, according to the phase deviation, the phase compensation on the first sine sampled signal through a preset algorithm to acquire at least one compensated sine sampled signal; and
a second compensation component, configured to perform, according to the phase deviation, the phase compensation on the first cosine sampled signal through a second preset algorithm to acquire at least one compensated cosine sampled signal.

* * * * *